(12) United States Patent
Kim et al.

(10) Patent No.: US 10,978,240 B2
(45) Date of Patent: Apr. 13, 2021

(54) INDUCTOR WITH EMBRACED CORNER CAPTURE PAD

(71) Applicant: QUALCOMM Incorporated, San Diego, CA (US)

(72) Inventors: Daeik Daniel Kim, Del Mar, CA (US); Babak Nejati, San Diego, CA (US); Husnu Ahmet Masaracioglu, La Jolla, CA (US)

(73) Assignee: Qualcomm Incorporated, San Diego, CA (US)

( * ) Notice: Subject to any disclaimer, the term of this patent is extended or adjusted under 35 U.S.C. 154(b) by 239 days.

(21) Appl. No.: 15/857,478

(22) Filed: Dec. 28, 2017

(65) Prior Publication Data

US 2018/0315540 A1    Nov. 1, 2018

Related U.S. Application Data

(60) Provisional application No. 62/492,797, filed on May 1, 2017.

(51) Int. Cl.
*H01F 27/29* (2006.01)
*H01F 27/28* (2006.01)
(Continued)

(52) U.S. Cl.
CPC ......... *H01F 27/2804* (2013.01); *H01F 5/003* (2013.01); *H01F 17/0013* (2013.01); *H01F 27/2885* (2013.01); *H01F 27/29* (2013.01); *H01F 27/292* (2013.01); *H01F 41/041* (2013.01); *H04B 1/006* (2013.01); *H04B 1/0064* (2013.01); *H05K 1/0237* (2013.01); *H05K 1/165* (2013.01); *H01F 2017/008* (2013.01); *H01F 2017/0073* (2013.01); *H01F 2027/2809* (2013.01); *H04B 1/40* (2013.01); *H05K 1/0233* (2013.01); *H05K 1/116* (2013.01);
(Continued)

(58) Field of Classification Search
USPC ........................................ 336/192, 200, 232
See application file for complete search history.

(56) References Cited

U.S. PATENT DOCUMENTS 8,212,155 B1   7/2012   Wright et al.
8,410,887 B2   4/2013   Nanjyo et al.
(Continued)

FOREIGN PATENT DOCUMENTS

CN    200956397 Y    10/2007
CN    100409384 C    8/2008

OTHER PUBLICATIONS

International Search Report and Written Opinion—PCT/US2018/024029—ISA/EPO—dated Jul. 5, 2018.

*Primary Examiner* — Shawki S Ismail
*Assistant Examiner* — Kazi S Hossain
(74) *Attorney, Agent, or Firm* — Seyfarth Shaw LLP

(57) ABSTRACT

A laminate substrate inductor reduces insertion loss and improves isolation while reducing the area for integrating the laminate substrate inductor. The laminate substrate includes a spiral trace. The laminate substrate also includes a first capture pad at a first end of the spiral trace. The first end is located at a corner of the spiral trace. The first capture pad is substantially within a bounding box of the spiral trace. At least a portion of the first capture pad and an outer edge of the spiral trace have a same distance from a ground.

13 Claims, 10 Drawing Sheets

(51) Int. Cl.

| | |
|---|---|
| *H01F 41/04* | (2006.01) |
| *H05K 1/02* | (2006.01) |
| *H01F 17/00* | (2006.01) |
| *H05K 1/16* | (2006.01) |
| *H01F 5/00* | (2006.01) |
| *H04B 1/00* | (2006.01) |
| *H04B 1/40* | (2015.01) |
| *H05K 1/11* | (2006.01) |
| *H05K 3/00* | (2006.01) |
| *H05K 3/42* | (2006.01) |

(52) U.S. Cl.
CPC .......... *H05K 3/0026* (2013.01); *H05K 3/429* (2013.01); *H05K 2201/093* (2013.01); *H05K 2201/09227* (2013.01); *H05K 2201/09263* (2013.01); *H05K 2201/09272* (2013.01); *H05K 2201/09454* (2013.01)

(56) References Cited

U.S. PATENT DOCUMENTS

| | | | |
|---|---|---|---|
| 9,460,841 B2 | 10/2016 | Fontana et al. | |
| 2003/0030994 A1* | 2/2003 | Takaya | H01F 5/06 |
| | | | 361/728 |
| 2006/0284718 A1* | 12/2006 | Baumgartner | H01F 17/0006 |
| | | | 336/223 |
| 2011/0317318 A1 | 12/2011 | Fleming et al. | |
| 2012/0249276 A1* | 10/2012 | Fontana | H01F 17/0013 |
| | | | 336/105 |
| 2015/0028988 A1 | 1/2015 | Yamauchi et al. | |
| 2015/0130021 A1 | 5/2015 | Kim et al. | |
| 2015/0348700 A1* | 12/2015 | Hong | H01F 27/362 |
| | | | 336/84 C |
| 2016/0344181 A1 | 11/2016 | Matsunaga | |
| 2017/0053727 A1 | 2/2017 | Eshima et al. | |
| 2017/0084378 A1 | 3/2017 | Leipold et al. | |
| 2017/0110237 A1 | 4/2017 | Kim et al. | |

* cited by examiner

INDUCTOR WITH EMBRACED CORNER CAPTURE PAD

CROSS-REFERENCE TO RELATED APPLICATION

The present application claims the benefit of U.S. Provisional Patent Application No. 62/492,797, filed on May 1, 2017, and titled "INDUCTOR WITH EMBRACED CORNER CAPTURE PAD," the disclosure of which is expressly incorporated by reference herein in its entirety.

BACKGROUND

Field

Aspects of the present disclosure relate to semiconductor devices, and more particularly, to inductors with embraced corner capture pads.

Background

Passive devices integrated in a substrate include high-performance inductor and capacitor components that have a variety of advantages over other technologies, such as surface mount technology that is commonly used in the fabrication of mobile radio frequency (RF) chip designs (e.g., mobile RF transceivers). Design challenges for mobile RF transceivers include analog/RF performance considerations, including mismatch, noise and other performance considerations. The design of these mobile RF transceivers includes the use of passive devices, for example, to suppress resonance, and/or to perform filtering, bypassing, and coupling in high power, system on chip devices, such as application processors and graphics processors.

The use of laminate integrated inductors may replace the use of surface mount devices within RF front-end modules due to spacing constraints. For example, multiple (e.g., 20 or more) printed inductors or laminate integrated inductors may be integrated in a laminate substrate. The multiple laminate integrated inductors may be integrated in a radio frequency front-end (RFFE) module for duplexers to facilitate reception, transmission, and antenna routing.

For example, some duplexers may support as many as eight (8) frequency bands for simultaneous transmission and reception. These duplexers exhibit surface acoustic layer features that specify an increased filter size, which increase the size of the duplexers. Because of the acoustic characteristics, the mechanical structure of the duplexers is akin to a large capacitor. For example, the input and output of the duplexers are highly capacitive. Accordingly, inductors are used to adjust impedance of the duplexers to a desirable value (e.g., original impedance of 50 ohms for the low noise amplifier (LNA), antenna switch matrix, controller, and/or power amplifier). For example, inductors are used in either series or shunt configurations or a combination of series and shunt configurations to achieve the adjustment. Multiple inductors are desirable within a small space to compensate for the high capacitance of the duplexers. The inductors occupy an increased amount of space because it takes a lot of area or volume to generate magnetic wave or flux, which generates the inductance value.

SUMMARY

A laminate substrate inductor may include a spiral trace and a first capture pad at a first end of the spiral trace. The first end is located at a corner of the spiral trace. The first capture pad is substantially within a bounding box of the spiral trace. At least a portion of the first capture pad and an outer edge of the spiral trace have a same distance from a ground.

A method of method of fabricating a laminate substrate inductor may include fabricating a spiral trace in a laminate substrate. The method may further include fabricating a first capture pad at a first end of the spiral trace. The first end is located at a corner of the spiral trace. The first capture pad is substantially within a bounding box of the spiral trace. At least a portion of the first capture pad and an outer edge of the spiral trace have a same distance from a ground.

A laminate substrate inductor may include a spiral trace. The laminate substrate inductor may further include a first means for connecting the spiral trace of the laminate substrate inductor at a first end. The first end is located at a corner of the spiral trace. The first connecting means is substantially within a bounding box of the spiral trace. At least a portion of the first connecting means and an outer edge of the spiral trace have a same distance from a ground.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
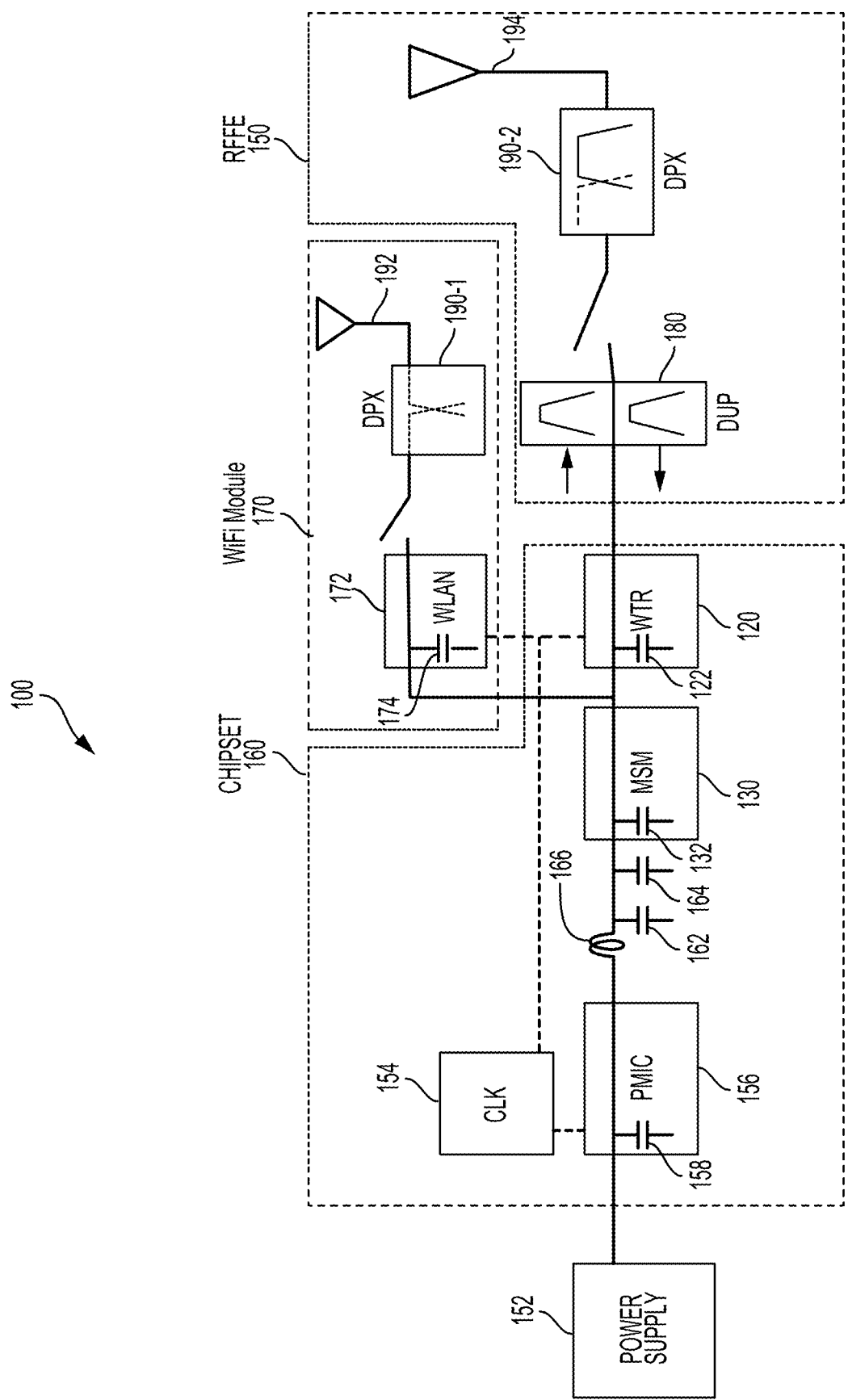
FIG. 1 is a diagram of a radio frequency (RF) communication system.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent to those skilled in the art, however, that these concepts may be practiced without these specific details. In some instances, well-known structures and components are shown in block diagram form in order to avoid obscuring such concepts. As described herein, the use of the term "and/or" is intended to represent an "inclusive OR," and the use of the term "or" is intended to represent an "exclusive OR."

Mobile radio frequency (RF) chip designs (e.g., mobile RF transceivers) have migrated to a deep sub-micron process node due to cost and power consumption considerations. The design complexity of mobile RF transceivers is further complicated by added circuit functions to support communication enhancements, such as carrier aggregation. Further design challenges for mobile RF transceivers include analog/RF performance considerations, including mismatch, noise, and other performance considerations. The design of these mobile RF transceivers includes the use of passive devices, for example, to suppress resonance and/or to perform filtering, bypassing, and coupling.

The passive devices include high-performance inductor and capacitor components that have a variety of advantages over other technologies, such as surface mount technology or multi-layer ceramic chips. These advantages include being more compact in size and having smaller manufacturing variations. Devices such as inductors may be implemented as three-dimensional (3D) structures or other structures. 3D inductors or other 3D devices may experience a number of design constraints due to their 3D implementation.

An inductor is an example of an electrical device used to temporarily store energy in a magnetic field within a wire coil according to an inductance value. This inductance value provides a measure of the ratio of voltage to the rate of change of current passing through the inductor. When the current flowing through an inductor changes, energy is temporarily stored in a magnetic field in the coil. In addition to their magnetic field storing capability, inductors are often used in alternating current (AC) electronic equipment, such as radio equipment. For example, the design of mobile RF transceivers includes the use of inductors with improved inductance density while reducing magnetic loss at high frequency (e.g., 500 megahertz (MHz) to 5 gigahertz (GHz) RF range).

Various aspects of the disclosure provide techniques for fabrication an inductor with embraced corner capture pads.

It will be understood that the term "layer" includes film and is not to be construed as indicating a vertical or horizontal thickness unless otherwise stated.

One goal driving the wireless communication industry is providing consumers with increased bandwidth. The use of carrier aggregation in current generation communications provides one possible solution for achieving this goal. For wireless communication, passive devices are used to process signals in carrier aggregation systems. In these carrier aggregation systems, signals are communicated with both high band and low band frequencies. In a radio frequency front-end (RFFE) module, a power amplifier (PA) may be integrated with a passive device (e.g., a duplexer). The duplexer (e.g., an acoustic filter) may be configured for simultaneous transmission and reception within the same band (e.g., a low band) to support carrier aggregation.

According to aspects of the present disclosure, the duplexer may be provided in a power amplifier (PA) module with an integrated duplexer (PAMID) module or a front-end module with an integrated duplexer (FEMID) module. The duplexer (e.g., an acoustic filter) is integrated with a laminate substrate inductor, such as a laminate integrated inductor. The use of laminate integrated inductors may replace the use of surface mount devices within RF front-end modules due to spacing constraints. For example, multiple (e.g., 20 or more) printed inductors or laminate integrated inductors may be integrated in a laminate substrate. The multiple laminate integrated inductors may be integrated in a radio frequency front-end (RFFE) module for duplexers, to facilitate reception, transmission, and antenna routing.

For example, some duplexers may support as many as eight (8) frequency bands for simultaneous transmission and reception. These duplexers exhibit surface acoustic layer features that specify an increased filter size, which increases the size of the duplexers. Because of the acoustic characteristics, the mechanical structure of the duplexers is akin to a large capacitor. For example, the input and output of the duplexers are highly capacitive. Accordingly, inductors are used to adjust impedance of the duplexers to a desirable value. Multiple inductors are desirable within a small space to compensate for the high capacitance of the duplexers. The inductors occupy an increased amount of space because a large area or volume is used to generate magnetic wave or flux, which generates the inductance value. The use of these inductors (e.g., printed inductors), however, may be expensive and the inductors tend to be very large. For example, a substrate technology may specify a large capture pad that may be 4-6 times larger than a minimum trace line and space. These types of inductor specifications prohibit tight integration and compromise isolation specifications.

Unfortunately, stringent specifications (e.g., long term evolution (LTE) low frequency band (LB) downlink carrier aggregation (DLCA) specifications) demand isolation between inductors as well as between inductors, ground, and RF traces. The inductors are positioned between RF traces that carry signals such as high power antenna signals. Without isolation, carrier aggregation cannot be supported. For example, an isolation issue exists when radio frequency or magnetic interference occurs between the RF traces and the inductors. The isolation issue is further magnified as a consequence of double downlink carrier aggregation where multiple (e.g., two) receive signals are active at the same time even though transmission occurs only one band at a time. Without proper isolation between the RF traces, the double downlink carrier aggregation may not be operational because the low power receive signals may be contaminated by the high power transmit signals.

For example, during simultaneous transmission and reception, the transmit power level may be 30 dBm and the receive power level may be as low as −120 dBm for a ratio of about 150 dB between the power level of the transmit signal and the power level of the receive signal. If there is not enough isolation, the transmit power can overcome the receive power and the LNA may not amplify the received signal. In some implementations, the space between the inductor and the RF trace is so small that a via cannot be positioned between the two. Capture pads associated with the inductor extend from the inductor and cause the RF trace to meander around the capture pads, increasing RF loss as well as increasing isolation and grounding complexities.

One way to improve isolation is to achieve tight inductor formation. Another way to create isolation is to introduce vias between the inductors as well as between the inductors and the RF traces. However, lack of space between the inductors and the RF traces and protruding layer-to-layer connecting vias (e.g., via capture pads) form a large open area around the inductor and the corresponding spiral, preventing tight inductor formation. For example, the inductors and clearance ground area of the RFFE module cause significant congestion. The meandering or winding of the RF traces are increased to avoid the inductors and to obtain isolation. The RF traces, however, experience unnecessary insertion losses as a result of the increased meandering.

Minimal or reduced spacing between the RF traces and the inductor degrades isolation. Additionally, the area occupied by the laminate integrated inductors within a substrate (e.g., a package substrate) may also be constrained due to customer specifications. The substrate generally includes ground planes to meet isolation specifications to avoid interference between the laminate integrated inductors and the duplexers.

Aspects of the present disclosure are directed to reducing insertion loss and improving isolation while reducing the area for integrating the inductors. The inductor may be integrated or hosted within a well-defined boundary to reduce isolation between the inductors and the RF traces and to prevent vias or capture pads associated with the inductors from extending beyond the well-defined boundary. As a result, a very high density inductor can be achieved such that high density printed inductor integration and isolation for LTE multiple-band realization and in-band group DLCA are improved. The well-defined boundary structure achieves a substantially constant isolation (based on a straight line RF trace) between the boundary of the inductor and the RF traces. The well-defined boundary structure avoids loss associated with the meandering RF traces to avoid protruding portions of inductors as in conventional implementations.

Some aspects of the disclosure include a laminate substrate inductor with a set of windings or a spiral trace and a capture pad coupled to the spiral trace. For example, the capture pad may be positioned at a first end of the spiral trace. The first end may be located at a corner of the spiral trace. The spiral trace may be bounded by a bounding box such that the capture pad of the laminate substrate inductor is embraced by the inductor turns. In this case, the capture pad is substantially positioned within the bounding box of the spiral trace. For example, the capture pad is substantially within a straight line perimeter of the spiral trace. An inner portion of the spiral trace extends past the capture pad at the corner. The inner portion is straight and may include the transition from a first turn to a second turn. In one aspect of the disclosure, the inner portion extends at a forty-five (45) degree angle relative to the perimeter. Alternatively, the inner portion may extend at an angle different than the forty-five degree angle.

In one aspect of the disclosure, the capture pad may be positioned such that a portion of the capture pad and an outer edge of the spiral trace have a same distance from a ground (electrical or RF ground). Effectively this aspect achieves a constant ground plane having a substantially constant ground clearance from the inductor and/or the capture pad. Without the constant ground clearance, the inductance of the inductor may be compromised. For example, the area between the RF trace and the inductor is grounded and the ground area has a constant ground clearance from the inductor relative to an inconsistent ground clearance when the inductor includes protruding portions. Without the constant ground clearance, the inductance of the inductor may deviate from an original value and a quality (Q)-factor of the inductor may deteriorate. In one aspect, a clearance between the inductor and the RF trace is maintained at substantially sixty (60) micrometers.

A second capture pad may also be included within the bounding box of the spiral trace. The laminate substrate inductor may be a multilayer inductor that extends across multiple layers of the substrate. The top and bottom layers of the multilayer inductor may be shielded. The multilayer inductor achieves high inductance (e.g., five (5) nH to twenty (20) nH) to compensate for the high capacitive value of the duplexers. A 20 nH inductance may specify a long (e.g., forty millimeter or less) RF trace that is wound within the well-defined boundary. The multiple layers (e.g., 4-6 layers) of the multilayer inductor are desirable to accommodate the long RF trace within a module.

FIG. 1 is a schematic diagram of a radio frequency (RF) communications system 100 including an inductor structure integrated with a duplexer 180 according to an aspect of the present disclosure. Representatively, the RF communications system 100 includes a WiFi module 170 having a first diplexer 190-1 and an RF front-end module 150 including a second diplexer 190-2 for a chipset 160 to provide carrier aggregation according to an aspect of the present disclosure. The WiFi module 170 includes the first diplexer 190-1 communicably coupling an antenna 192 to a wireless local area network module (e.g., WLAN module 172). The RF front-end module 150 includes the second diplexer 190-2 communicably coupling an antenna 194 to a wireless transceiver (WTR) 120 through the duplexer 180. The wireless transceiver 120 and the WLAN module 172 of the WiFi module 170 are coupled to a modem (mobile station modem (MSM), e.g., baseband modem) 130 that is powered by a power supply 152 through a power management integrated circuit (PMIC) 156.

The chipset 160 also includes capacitors 162 and 164, as well as an inductor(s) 166 to provide signal integrity. The PMIC 156, the modem 130, the wireless transceiver 120, and the WLAN module 172 each include capacitors (e.g., 158, 132, 122, and 174) and operate according to a clock 154. The geometry and arrangement of the various inductor and capacitor components in the chipset 160 may reduce the electromagnetic coupling between the components. The RF communications system 100 may also include a power amplifier (PA) integrated with the duplexer 180 (e.g., a PAMID module). The duplexer 180 may filter the input/output signals according to a variety of different parameters, including frequency, insertion loss, rejection, or other like parameters. According to aspects of the present disclosure, the duplexer 180 may be integrated with an inductor structure.

Figure 2:
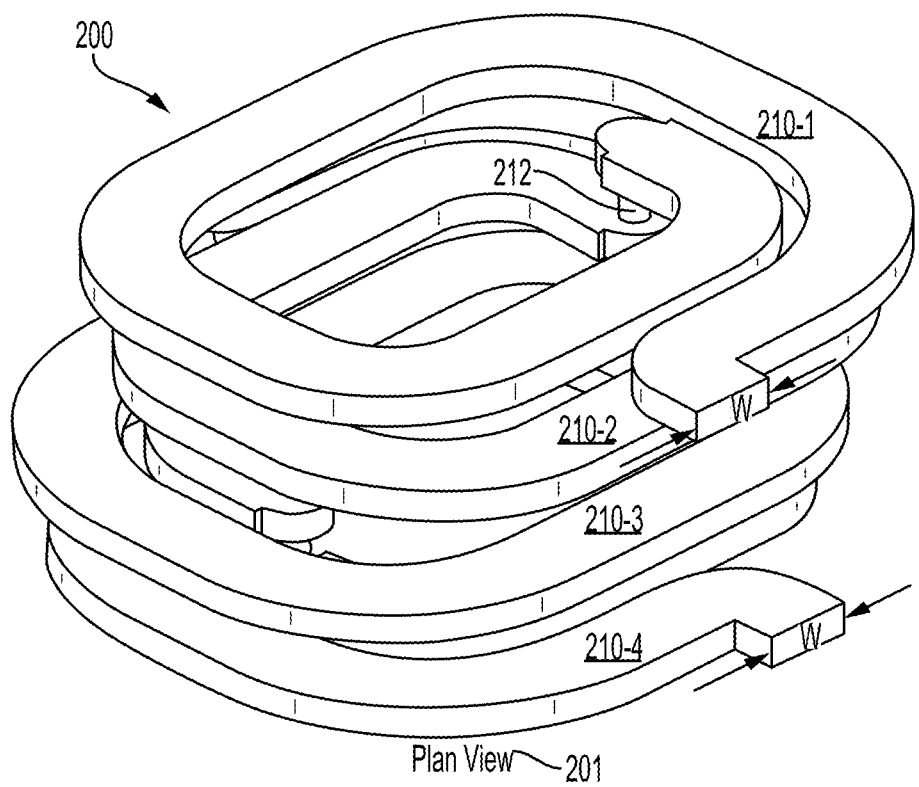
FIG. 2 shows a perspective of a laminate inductor structure.

FIG. 2 shows a plan view 201 of an inductor structure 200. Representatively, the inductor structure 200 is composed of a first trace 210-1, a second trace 210-2, a third trace 210-3, and a fourth trace 210-4, each having a fixed width W. The first trace 210-1, the second trace 210-2, the third trace 210-3, and the fourth trace 210-4 are arranged in overlapping spiral patterns coupled at a trace beginning/end of the inductor structure 200 using a via 212. The inductor structure 200 is arranged according to a multi-turn configuration.

According to aspects of the present disclosure, a duplexer may be arranged in a power amplifier (PA) integrated duplexer (PAMID) module or a front-end module with integrated duplexer (FEMID) module, in which the duplexer is integrated with a laminate substrate inductor, such as the laminate inductor structure 250. The use of laminate integrated inductors may replace the use of surface mount devices within, for example, the RF front-end module 150 (FIG. 1) due to spacing constraints.

Figure 3:
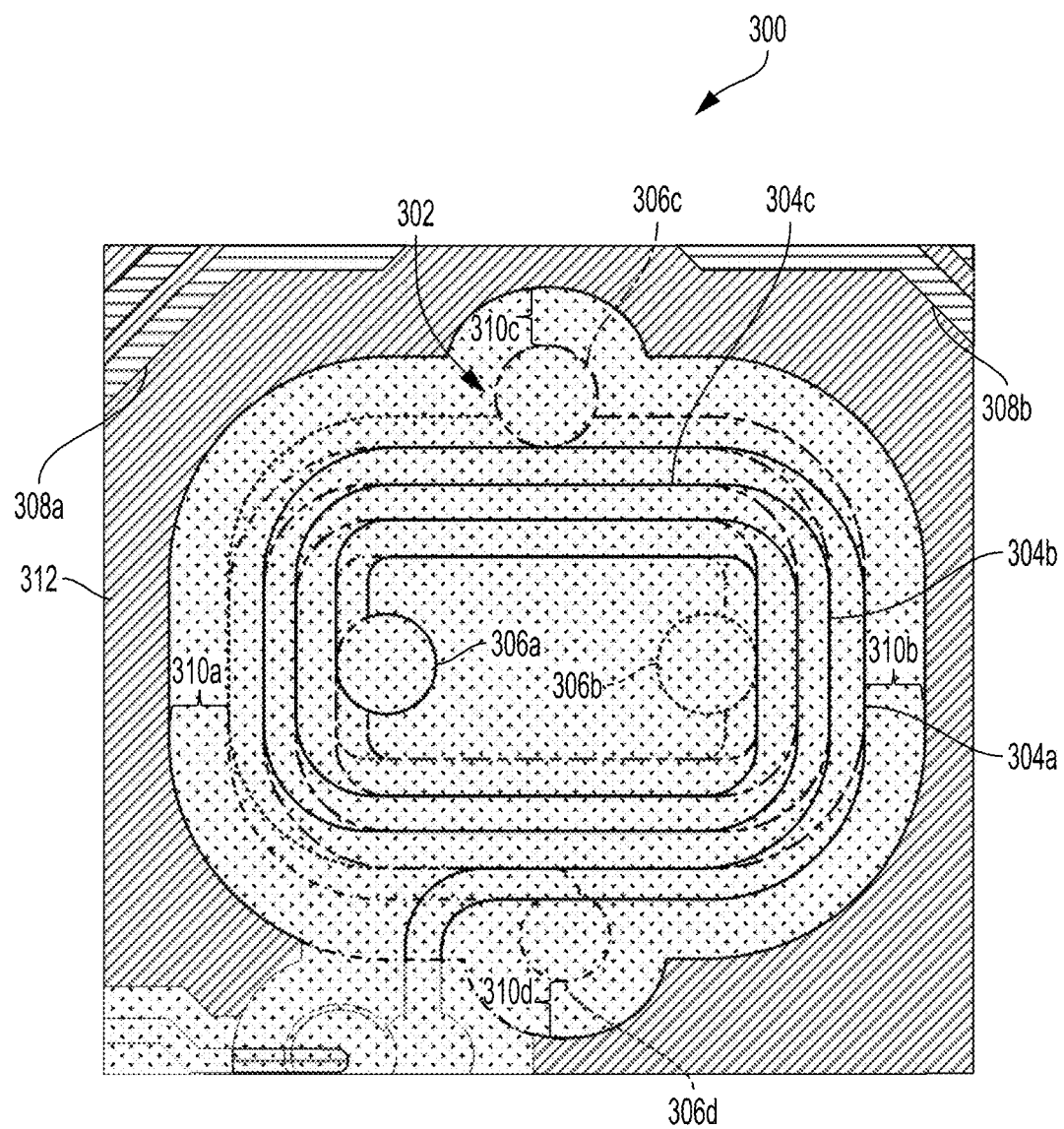
FIG. 3 illustrates an example of an electronic board including an integrated inductor with extending via capture pads and corresponding non-uniform ground clearance area.

FIG. 3 illustrates an example of an electronic board 300 (e.g., printed circuit board) including an integrated inductor 302 with extending via capture pads and corresponding non-uniform ground clearance area. The printed circuit board 300 may be a printed circuit board of a radio frequency front-end (RFFE) module. The inductor 302 may be integrated in a substrate (e.g., laminate substrate). Multiple turns (e.g., turns 304a, 304b, and 304c) forming a spiral trace of the inductor 302 are included to achieve a desirable inductance. The electronic board 300 also includes a ground plane 312. For example, the ground plane 312 on the printed circuit board 300 is a large area or layer of copper foil connected to the circuit's ground point, usually one terminal of the power supply. The ground plane 312 serves as the return path for current from many different components.

The integrated inductor 302 also includes via capture pads 306a, 306b, 306c and 306d and corresponding ground clearance areas 310a, 310b, 310c, and 310d. The via capture pads 306a and 306b of the inductor 302 are within a perimeter of one or more of the multiple turns (e.g., turns 304a, 304b, and 304c) forming the spiral trace of the indictor 302. However, the via capture pads 306c and 306d are extending relative to the multiple turns. Accordingly, the corresponding ground clearance areas 310c and 310d are extending while the ground clearance areas 310a and 310b are not extending relative to the perimeter of one or more of the multiple turns. For example, the via capture pads 306c and 306d are external to an outer perimeter of the multiple turns.

The inductor 302 may be positioned between RF traces 308a and 308b that carry signals such as high power antenna signals. An isolation issue exists when radio frequency or magnetic interference occurs between the RF traces 308a or 308b and the inductor 302. The extending capture pad 306c associated with the inductor 302 extends from the inductor 302 and cause the RF trace 308a or 308b to meander around the extending capture pad 306c, increasing RF loss as well as increasing isolation and grounding complexities.

Figure 4:
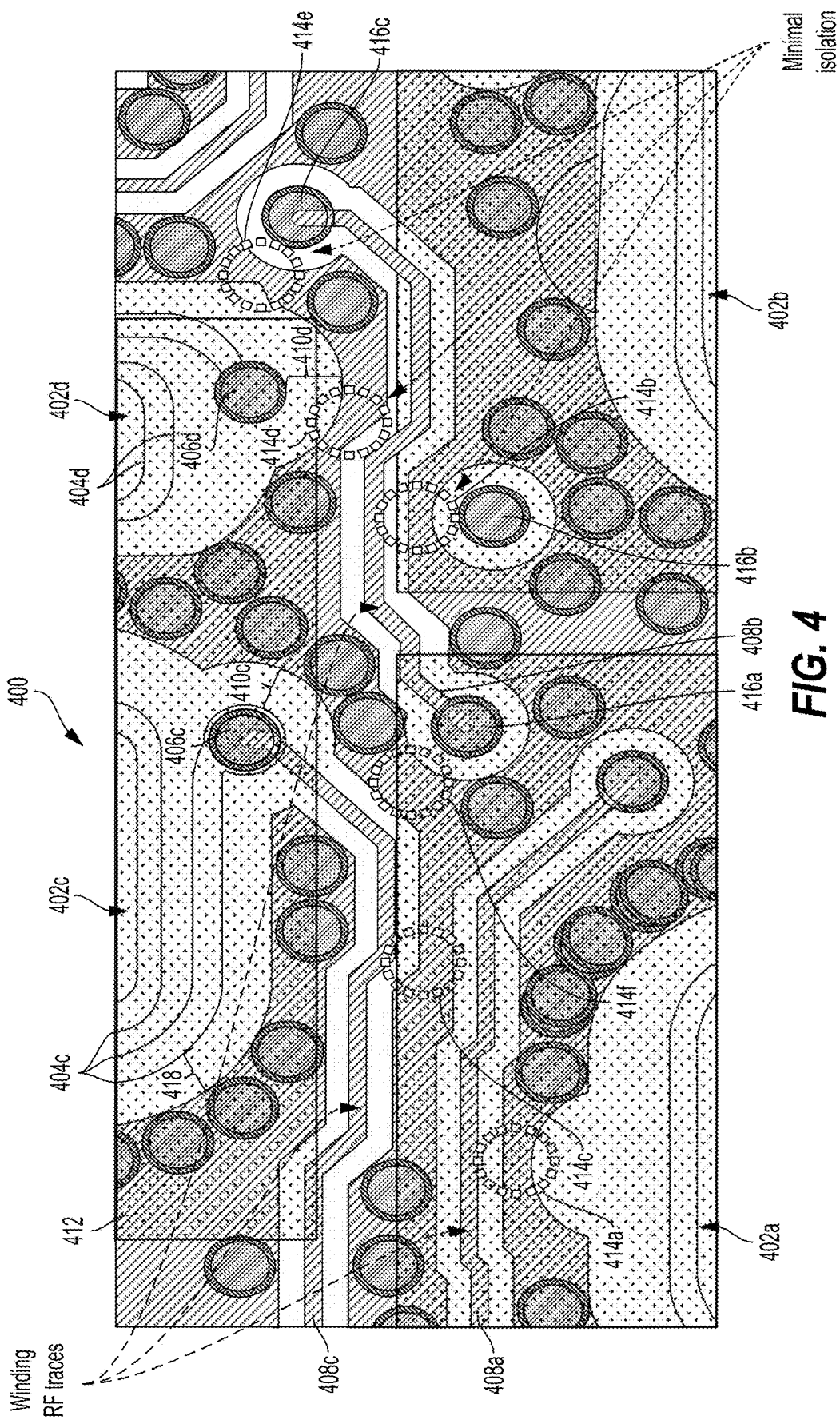
FIG. 4 illustrates an example of an electronic board including integrated inductors having winding radio frequency traces that introduce isolation deficiencies to the electronic board

FIG. 4 illustrates an example of an electronic board 400 including integrated inductors 402a, 402b, 402c, and 402d having winding radio frequency traces that introduce isolation deficiencies to the electronic board. The inductor 402c includes a first via capture pad 406c and a corresponding ground clearance area 410c. The inductor 402d includes a second via capture pad 406d and a corresponding ground clearance area 410d. The ground clearance areas 410c and 410d provide a separation between their respective corresponding capture pads 406c and 406d of the inductors 402c and 402d and a ground plane 412 for isolation.

The first via capture pad 406c and the corresponding ground clearance area 410c are extending. Similarly, the second via capture pad 406d and corresponding ground clearance area 410d are also extending. Thus, some portions of the via capture pads 406c and 406d are outside of a perimeter of their respective sets of multiple turns 404c and 404d forming spiral traces of the inductors 402c and 402d. Similarly, one or more portions of the corresponding ground clearance areas 410c and 410d are extending relative to a perimeter of non-extending ground clearance areas (e.g., 418). Having the ground clearance areas 410c and 410c outside of the perimeter of non-extending ground clearance areas corresponds to a non-uniform ground clearance area.

The inductors 402a, 402b, 402c, and 402d are positioned between RF traces 408a, 408b, and 408c that carry signals such as the high power antenna signals. For example, the extending capture pads 406c and 406d and corresponding ground clearance areas 410c and 410d cause the RF trace 408b to meander around the extending capture pads 406c and 406d and their corresponding ground clearance areas 410c and 410d. The meandering increases RF loss as well as isolation and grounding complexities. In some implementations, a space between the inductor 402d and the RF trace 408b is so small that a via and corresponding via contact pad cannot be positioned between the two. The space constraint in this case is a good indicator of a lack of isolation (or increased isolation complexities) between the extending capture pad 406d and its corresponding ground clearance area 410d and the RF trace 408b. The space constraint due to the meandering of the RF traces further increases isolation complexities between the RF traces. For illustrative purpose, virtual vias and corresponding virtual contact pads 414a-414f are displayed on the electronic board 400 to illustrate the lack of isolation or reduced isolation between the RF traces 408a-408c, the inductors 402a-402d, and the ports 416a-416c.

Figure 5:
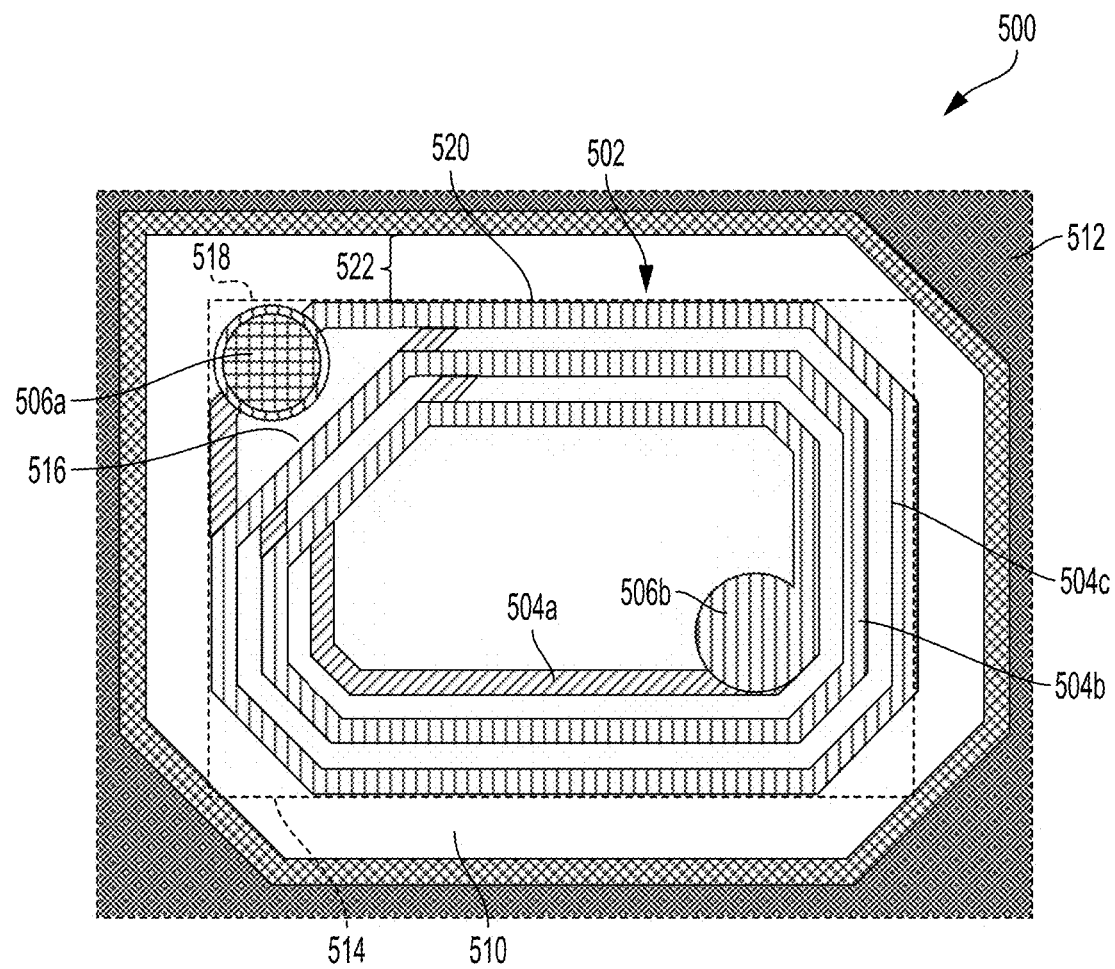
FIG. 5 illustrates an example of an electronic board including an integrated inductor with non-extending via capture pads and corresponding uniform ground clearance area, according to aspects of the present disclosure.

FIG. 5 illustrates an example of an electronic board 500 (e.g., printed circuit board) including an integrated inductor 502 with non-extending via capture pads and corresponding uniform ground clearance area. The inductor 502 may be integrated in a substrate (e.g., laminate substrate). Multiple turns (e.g., turns 504a, 504b, and 504c) of the inductor 502 are included to achieve a desirable inductance. The electronic board 500 also includes a ground plane 512. For example, the ground plane 512 on the printed circuit board 500 is a large area or layer of copper foil connected to a circuit's ground point, usually one terminal of a power supply. The integrated inductor 502 also includes via capture pads 506a and 506b as well as corresponding ground clearance area 510.

The inductor 502 may be integrated or hosted within a well-defined boundary 514 to reduce isolation between the inductor and the RF traces and to prevent vias or capture pads associated with the inductor 502 from extending beyond the well-defined boundary 514. For example, the via capture pads 506a and 506b of the inductor 502 are within the well-defined boundary 514 (e.g., virtual perimeter). The virtual perimeter may be based on outer portions of one or more of the multiple turns forming the spiral trace of the inductor 502.

For example, the via capture pad 506a may be positioned at a first end of the spiral trace. The first end may be located at a corner of the multiple turns 504a, 504b, and 504c forming the spiral trace of the inductor 502. The multiple turns 504a, 504b, and 504c may be bounded by the well-defined boundary 514. The via capture pad 506a is substantially positioned within the well-defined boundary 514 of the multiple turns 504a, 504b, and 504c. For example, the via capture pad 506a is substantially within a straight line perimeter of the spiral trace. An inner portion 516 (relative to the straight line perimeter) of the spiral trace extends past the via capture pad 506a at the corner. The inner portion 516 is straight and may include the transition from a first turn 504c to a second turn 504a. In one aspect of the disclosure, the inner portion 516 extends at a forty-five (45) degree angle relative to the perimeter. The capture pad 506a may be positioned such that a portion 518 of the capture pad 506a and an outer edge 520 of the spiral trace (e.g., turn 504c) have a same distance 522 from the ground plane 512.

Figure 6:
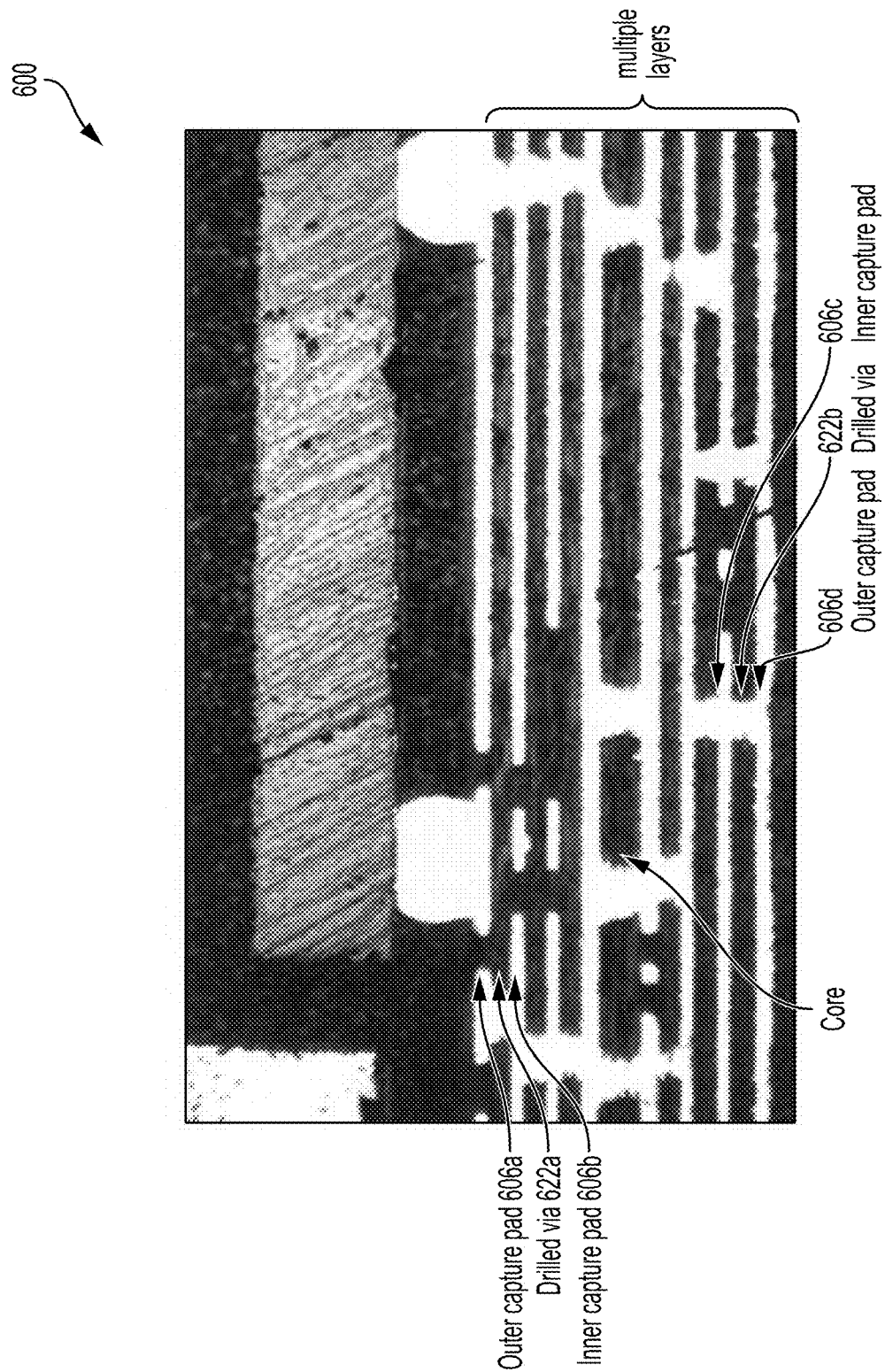
FIG. 6 illustrates a cross-section of a laminate substrate including a laminate substrate inductor, according to aspects of the present disclosure.

FIG. 6 illustrates a cross-section of a laminate substrate 600 including a laminate substrate inductor, according to aspects of the present disclosure. The laminate substrate 600 may include multiple layers (e.g., eight layers) such that the laminate substrate inductor extends across multiple layers of the laminate substrate 600. Included in the multiple layers of the laminate substrate 600 are a first outer capture pad 606a and a first inner capture pad 606b that may be on different layers and coupled together by a drilled via 622a. A second inner capture pad 606c and a second outer capture pad 606d are coupled together by a drilled via 622b. In one aspect of the disclosure, a first (e.g., top) layer and a second (e.g., bottom) layer of the multilayer inductor may be shielded. In one aspect, the first layer and the second layer may be shielded by the ground plane around the multilayer inductor. For example, the shield may surround ground layers and via walls. Alternatively, shielding may be achieved by a separate side wall conformal shield.

Figure 7:
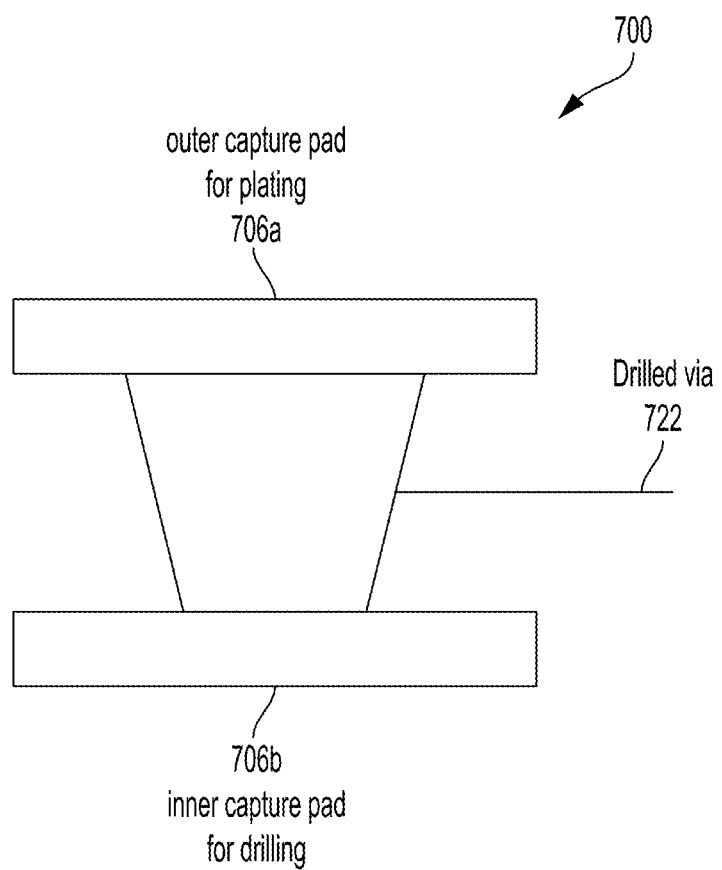
FIG. 7 illustrates an inductor that includes a first capture pad, a second capture pad, and a drilled via that couples the first capture pad to the second capture pad, according to aspects of the present disclosure.

FIG. 7 illustrates a portion of an inductor 700 that includes a first (or outer) capture pad 706a, a second (or inner) capture pad 706b and a drilled via 722 that couples the first capture pad 706a to the second capture pad 706b. In some implementations, the first capture pad is part of a first layer of a laminate substrate and the second capture pad 706b is part of a second layer of the laminate substrate. The inductor 700 is based on a laminate process that specifies the inner capture pad 706b for laser drilling and the outer capture pad 706a for plating. The inner capture pad 706b (or laser drilling stop) prevents laser penetration during laser drilling. The outer capture pad 706a may have a larger width than the width of the drilled via 722 even though the drilled via 722 and the outer capture pad 706a are plated simultaneously.

Figure 8:
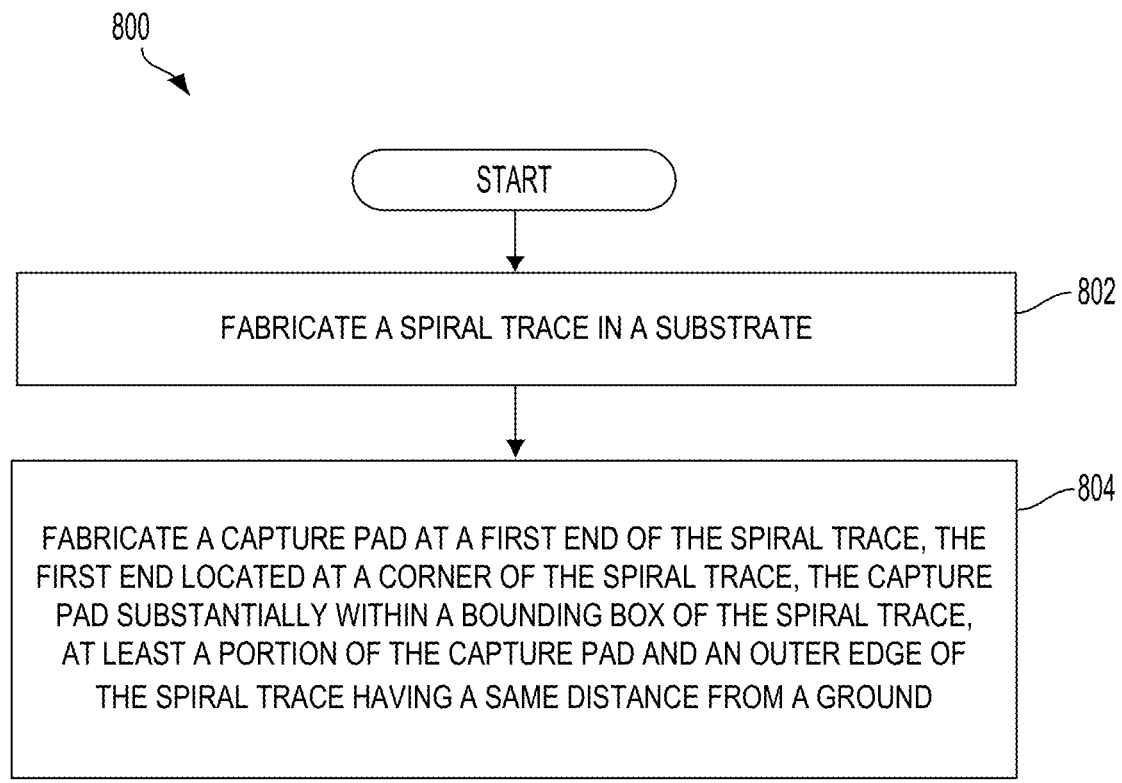
FIG. 8 is a flow diagram illustrating a method of fabricating a laminate substrate inductor according to aspects of the disclosure.

FIG. 8 is a flow diagram 800 illustrating a method of fabricating a laminate substrate inductor, according to aspects of the present disclosure. At block 802, a spiral trace is fabricated in a substrate (e.g., laminate substrate). At block 804, a capture pad at a first end of the spiral trace is fabricated in the laminate substrate. The first end is located at a corner of the spiral trace. The capture pad is substantially within a bounding box of the spiral trace, at one or more portions of the capture pad. An outer edge of the spiral trace has a same distance from a ground as a portion of the capture pad. The capture pad size may be large (e.g., 100-120 μm) for drill sizes of 60-70 μm and line/space (L/S) width of 25/25 μm.

According to one aspect of the present disclosure, a laminate substrate is described. The laminate substrate includes first means for connecting the spiral trace of the laminate substrate inductor at a first end. The first connecting means may be, for example, the first outer capture pad 606a, and/or the capture pad 706a. In another aspect, the aforementioned means may be any module or any apparatus or material configured to perform the functions recited by the aforementioned means.

Figure 9:
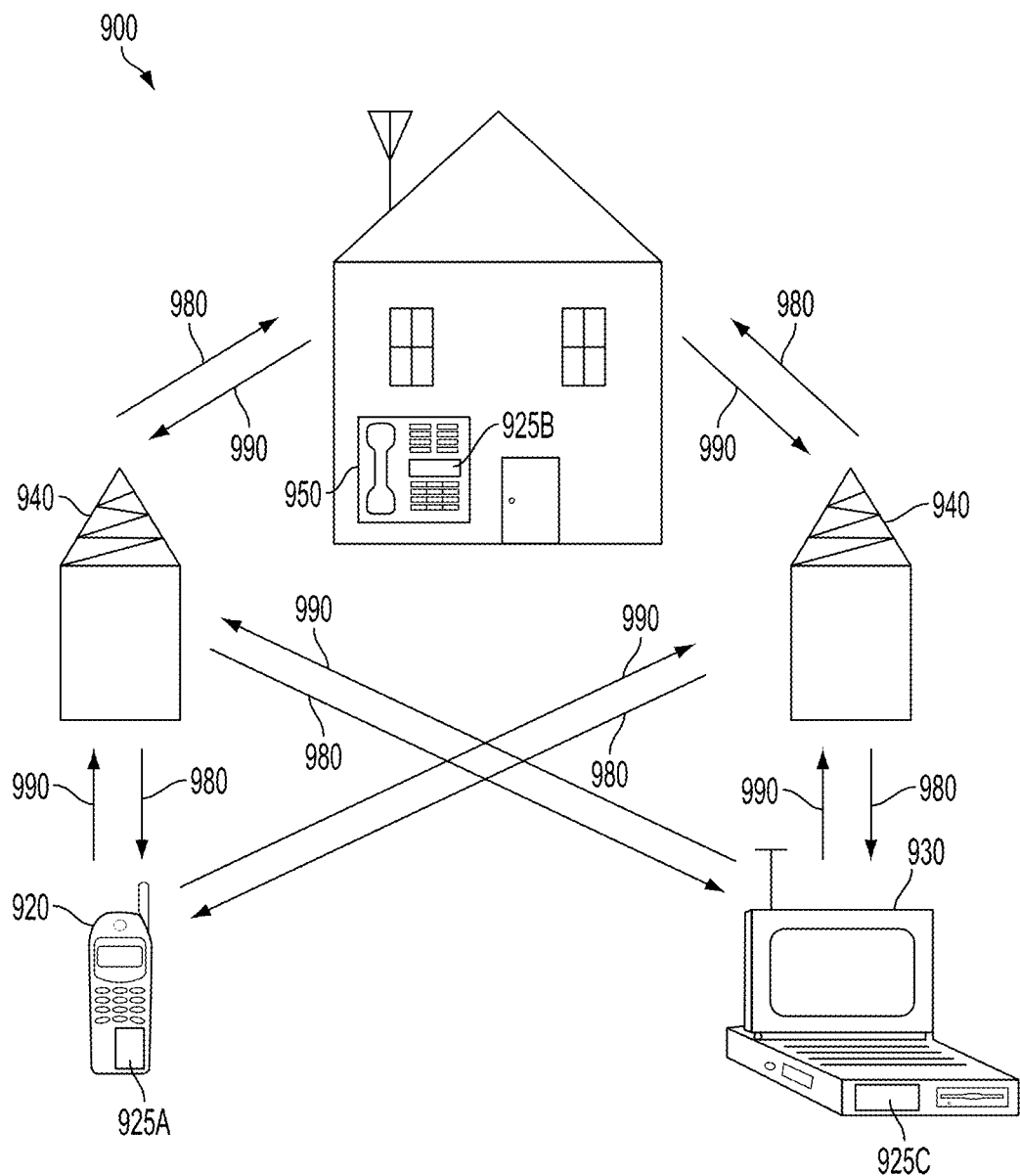
FIG. 9 is a block diagram showing an exemplary wireless communication system in which a configuration of the disclosure may be advantageously employed.

FIG. 9 is a block diagram showing an exemplary wireless communication system 900 in which an aspect of the disclosure may be advantageously employed. For purposes of illustration, FIG. 9 shows three of the remote units 920, 930, and 950 and two of the base stations 940. It will be recognized that wireless communication systems may have many more remote units and base stations. Remote units 920, 930, and 950 each include IC devices 925A, 925C, and 925B having a radio frequency (RF) front-end module that includes the disclosed laminate substrate inductor. It will be recognized that other devices may also include the disclosed laminate substrate inductor, such as the base stations, switching devices, and network equipment including a RF front-end module. FIG. 9 shows forward link signals 980 from one of the base stations 940 to the remote units 920, 930, and 950 and reverse link signals 990 from the remote units 920, 930, and 950 to base stations 940.

In FIG. 9, one of the remote units 920 is shown as a mobile telephone, one of the remote units 930 is shown as a portable computer, and remote unit 950 is shown as a fixed location remote unit in a wireless local loop system. For example, the remote units 920, 930, and 950 may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or a communications device, including an RF front-end module, that stores or retrieves data or computer instructions, or combinations thereof. Although FIG. 9 illustrates remote units according to the aspects of the disclosure, the disclosure is not limited to these exemplary illustrated units. Aspects of the disclosure may be suitably employed in many devices, which include the disclosed laminate substrate inductor.

Figure 10:
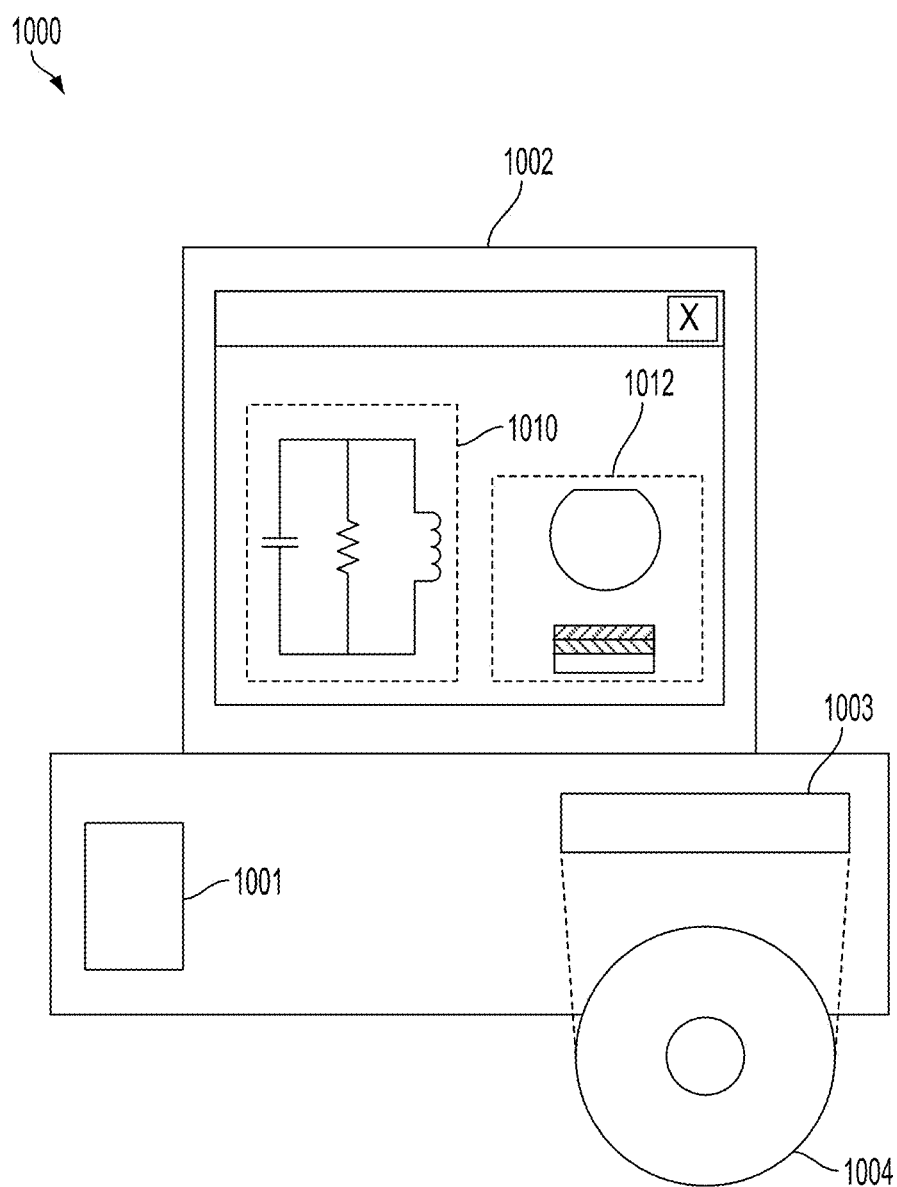
FIG. 10 is a block diagram illustrating a design workstation used for circuit, layout, and logic design of the laminate substrate inductor according to aspects of the present disclosure.

FIG. 10 is a block diagram illustrating a design workstation used for circuit, layout, and logic design of the laminate substrate inductor disclosed above. A design workstation 1000 includes a hard disk 1001 containing operating system software, support files, and design software such as Cadence or OrCAD. The design workstation 1000 also includes a display 1002 to facilitate design of a circuit 1010 or a laminate substrate inductor. A storage medium 1004 is provided for tangibly storing the design of the circuit 1010 or the laminate substrate inductor. The design of the circuit 1010 or the laminate substrate inductor may be stored on the storage medium 1004 in a file format such as GDSII or GERBER. The storage medium 1004 may be a CD-ROM, DVD, hard disk, flash memory, or other appropriate device. Furthermore, the design workstation 1000 includes a drive apparatus 1003 for accepting input from or writing output to the storage medium 1004.

Data recorded on the storage medium 1004 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1004 facilitates the design of the circuit 1010 or the laminate substrate inductor by decreasing the number of processes for designing semiconductor or passive wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD) and Blu-ray disc where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods, and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. In addition, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), and Blu-ray disc where disks usually reproduce data magnetically, while discs reproduce data optically with lasers. Combinations of the above should also be included within the scope of computer-readable media.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "a step for."

What is claimed is:

1. A laminate substrate inductor, comprising:
   a spiral trace; and
   a first capture pad at a first end of the spiral trace, the first end located at a corner of the spiral trace, the first capture pad within a minimum bounding box of the spiral trace such that a line coinciding with and extending from an outer edge of the spiral trace towards the first capture pad would not intersect with the first capture pad, the first capture pad being at least as far as the outer edge of the spiral trace from a ground.

2. The laminate substrate inductor of claim 1, in which a straight line inner portion of the spiral trace extends past the first capture pad at the corner.

3. The laminate substrate inductor of claim 2, in which the straight line inner portion extends at a forty five (45) degree angle relative to a perimeter of the spiral trace.

4. The laminate substrate inductor of claim 1, further comprising a second capture pad within the bounding box.

5. The laminate substrate inductor of claim 1, comprising a multi-layer inductor.

6. The laminate substrate inductor of claim 5, in which a first layer of the multi-layer inductor and a second layer of the multi-layer inductor opposite the first layer are shielded.

7. The laminate substrate inductor of claim 5, in which each capture pad on each layer of the multi-layer inductor is substantially within the bounding box.

8. The laminate substrate inductor of claim 1, integrated into a radio frequency (RF) front-end module, the RF front-end module incorporated into at least one of a music player, a video player, an entertainment unit, a navigation device, a communications device, a personal digital assistant (PDA), a fixed location data unit, a mobile phone, and a portable computer.

9. A laminate substrate inductor, comprising:
   a spiral trace; and
   first means for connecting the spiral trace of the laminate substrate inductor at a first end, the first end located at a corner of the spiral trace, the first connecting means within a minimum bounding box of the spiral trace such that a line coinciding with and extending from an outer edge of the spiral trace towards the first connecting means would not intersect with the first connecting means, the first connecting means being at least as far as the outer edge of the spiral trace from a ground.

10. The laminate substrate inductor of claim 9, in which a straight line inner portion of the spiral trace extends past the first connecting means at the corner.

11. The laminate substrate inductor of claim 10, in which the straight line inner portion extends at a forty five (45) degree angle relative to a perimeter of the spiral trace.

12. The laminate substrate inductor of claim 9, further comprising second means for connecting the spiral trace within the bounding box.

13. The laminate substrate inductor of claim 9, integrated into a radio frequency (RF) front-end module, the RF front-end module incorporated into at least one of a music player, a video player, an entertainment unit, a navigation device, a communications device, a personal digital assistant (PDA), a fixed location data unit, a mobile phone, and a portable computer.

* * * * *